United States Patent Office 3,789,007

Patented Jan. 29, 1974

3,789,007

METHOD OF CLEANING

Peter Robinson, Runcorn, England, assignor to Imperial Chemical Industries Limited, London, England No Drawing. Filed Aug. 3, 1971, Ser. No. 168,775
Claims priority, application Great Britain, Aug. 12, 1970, 38,870/70
Int. Cl. C11d 3/44
U.S. Cl. 252—171 5 Claims

ABSTRACT OF THE DISCLOSURE

A method for the removal of resists from printed circuit boards which comprises treating the board with a mixture comprising 85% to 97% by weight of methylene chloride and 15% to 3% by weight of methanol.

This invention relates to a method of cleaning and in particular to the removal of resists from circuit boards.

In the manufacture of printed circuit boards, a sheet of copper or similar metal is laminated to a suitable base. The copper or other metal is then coated with a material which is resistant to substances used to etch the sheet of metal. These materials are known as "resists" and are well known in the art. The base metal which is to be etched is then exposed and the metal etched away, for example with sulphuric acid. Finally, the remaining resist has to be removed to leave a clean printed circuit board.

The final removal of the resists presents a great problem since they are not easily dissolved or removed by commonly used organic solvents, particularly non-inflammable solvents.

We have now found that resists can be removed by treatment with mixtures of methylene chloride and methanol.

Thus according to the invention there is provided a method for the removal of resists from printed circuit boards which comprises treating the board with a mixture comprising 85% to 97% by weight of methylene chloride and 15% to 3% by weight of methanol.

Methylene chloride and methanol form an azeotrope which comprises about 92.9% by weight methylene chloride and about 7.1% by weight methanol, having a boiling point of 39.2° C. at 760 mm. Hg. It is particularly preferred to use substantially the azeotropic mixture since there is little or no component separation during use, although mixtures having a composition of 91% to 94% by weight of methylene chloride and 9% to 6% by weight of methanol may conveniently be used. These mixtures are substantially noninflammable and can be used in plants where the inflammability of methanol would preclude its use.

Preferably, the treatment according to the invention may be carried out using a liquid mixture, for example at room temperature, although the treatment may alternatively or additionally be carried out by immersing the boards in refluxing liquid. If desired the boards may be given a final rinse in the vapour of the mixture.

The time of treatment will depend among other factors, on the type of resist but will generally be from 15 seconds to 3 minutes.

If desired the treatment may be facilitated by using ultrasonic agitation and/or brushing, e.g. with a nylon brush.

The invention is particularly suitable for removal of polymerised resists which are deposited on the board as a solid monomer and then polymerised by ultra-violet light. These resists commonly comprse methyl methacrylate polymers and usually present the greatest difficulty in removal. Examples of such resists are described in British patent specification No. 1,128,850 and U.S. Pat. 3,448,089. However, the invention is also applicable in the removal of other commonly used resists, for example those deposited as a liquid and allowed to solidify, e.g., shellac resins.

The invention is illustrated in the following example:

Example

A number of copper circuit boards were coated with various resists which were then cured by heating in an oven and then exposed to sunlight. The boards were treated with various solvents. The results and conditions are given in the following table:

| | | Resists | | |
|---|---|---|---|---|
| | Conditions | 'Dynachem' photoresist | 'Techpro' | Du Pont Riston (Polymethyl methacrylate) |
| Methylene chloride/methanol azeotrope. | Cold soak. | Almost instant removal. | Total removal after one minute. | Total removal after 30 sec. with ultrasonic agitation. |
| Methylene chloride. | do | Only partial removal. | Brushing required for total removal. | Total removal after 2 min. With ultrasonic agitation. |
| Trichloroethylene. | do | Only partial removal with ultrasonic agitation. | | |
| Do | Boiling | No removal | | |

What we claim is:

1. A method for the removal of resists from printed circuit boards which comprises treating the board with a solvent composition consisting essentially of 85% to 97% by weight of methylene chloride and 15% to 3% by weight of methanol.

2. A method according to claim 1 in which the composition is 91% to 94% by weight of methylene chloride and 9% to 6% by weight of methanol.

3. A method according to claim 2 in which the composition is substantially the azeotropic mixture comprising about 92.9% by weight of methylene chloride and about 7.1% by weight methanol.

4. A method according to claim 1 in which the treatment is carried out using a liquid mixture.

5. A method according to claim 1 in which the resist is a methyl methacrylate polymer resist.

References Cited

UNITED STATES PATENTS

| | | | |
|---|---|---|---|
| 3,400,077 | 9/1968 | Orfeo et al. | 252—67 |
| 2,503,119 | 4/1950 | McKinnis | 252—D19 #9 |

WILLIAM E. SCHULZ, Primary Examiner

U.S. Cl. X.R.

134—40; 252—67, Digest #9